(12) United States Patent
Moon et al.

(10) Patent No.: US 12,713,782 B2
(45) Date of Patent: Aug. 18, 2026

(54) DISPLAY DEVICE WITH ELECTRODE-BARRIER STRUCTURE AND METHOD OF MANUFACTURING THE SAME

(71) Applicant: Samsung Display Co., LTD., Yongin-si (KR)

(72) Inventors: Young Min Moon, Yongin-si (KR); A Rong Kim, Yongin-si (KR); Hee Min Park, Yongin-si (KR); Sung Soon Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 361 days.

(21) Appl. No.: 18/583,738

(22) Filed: Feb. 21, 2024

(65) Prior Publication Data

US 2025/0017048 A1 Jan. 9, 2025

(30) Foreign Application Priority Data

Jul. 6, 2023 (KR) ........................ 10-2023-0087874

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC ......................... H10K 59/122; H10K 59/1201
See application file for complete search history.

(56) References Cited

U.S. PATENT DOCUMENTS

| | | | | |
|---|---|---|---|---|
| 8,003,417 | B2 | 8/2011 | Li et al. | |
| 9,117,785 | B2 | 8/2015 | Kashiwabara et al. | |
| 10,784,320 | B2 * | 9/2020 | Park | H10K 59/35 |
| 11,056,547 | B2 | 7/2021 | Lee | |
| 2023/0006009 | A1 | 1/2023 | Liu et al. | |
| 2023/0094306 | A1 * | 3/2023 | Park | H10K 59/124 257/40 |
| 2024/0063336 | A1 * | 2/2024 | Shi | H10H 20/815 |

FOREIGN PATENT DOCUMENTS

| | | | |
|---|---|---|---|
| CN | 111628105 | A | 9/2020 |
| KR | 10-1254748 | B1 | 4/2013 |
| KR | 10-2018-0079037 | A | 7/2018 |
| KR | 10-2219428 | B1 | 2/2021 |

* cited by examiner

*Primary Examiner* — Ajay Arora
(74) *Attorney, Agent, or Firm* — Womble Bond Dickinson (US) LLP

(57) ABSTRACT

A display device includes: a light emitting element on a base layer and including a first electrode, a second electrode, and a light emitting part electrically connected between the first electrode and the second electrode; a pixel defining layer on the base layer; a barrier layer on the pixel defining layer; and an electrode on the barrier layer, wherein the first electrode includes a (1_1)-th electrode and a (1_2)-th electrode, the pixel defining layer is between the (1_1)-th electrode and the (1_2)-th electrode, the light emitting part includes a first light emitting part electrically connected to the (1_1)-th electrode and a second light emitting part electrically connected to the (1_2)-th electrode, and the electrode and the barrier layer are between the first light emitting part and the second light emitting part in a plan view.

20 Claims, 13 Drawing Sheets

DISPLAY DEVICE WITH ELECTRODE-BARRIER STRUCTURE AND METHOD OF MANUFACTURING THE SAME

CROSS-REFERENCE TO RELATED APPLICATION

The present application claims priority to and the benefit of Korean patent application No. 10-2023-0087874, filed on Jul. 6, 2023, in the Korean Intellectual Property Office, the entire disclosure of which is incorporated herein by reference.

BACKGROUND

1. Field

Aspects of some embodiments of the present disclosure relate to a display device and a method of manufacturing the display device.

2. Description of the Related Art

As information technology develops, the importance of display devices providing a connection medium between users and information has increased. Such display devices may include a light emitting element, and may include sub-pixels adjacent to each other using the light emitting element.

An electrical signal supplied to each of the sub-pixels adjacent to each other may desirably be distinguished. For example, a risk that electrical signals are confused may occur due to a leakage current (lateral leakage) generated between the sub-pixels.

The above information disclosed in this Background section is only for enhancement of understanding of the background and therefore the information discussed in this Background section does not necessarily constitute prior art.

SUMMARY

Aspects of some embodiments include a display device and a method of manufacturing the display device capable of reducing a risk such as a leakage current.

Aspects of some embodiments include a display device and a method of manufacturing the display device capable of preventing or reducing damage to configurations in the display device.

Aspects of some embodiments include a display device and a method of manufacturing the display device capable of implementing display performance of relatively high resolution.

According to some embodiments of the present disclosure, a display device may include a light emitting element on a base layer and including a first electrode, a second electrode, and a light emitting part electrically connected between the first electrode and the second electrode, a pixel defining layer on the base layer, a barrier layer on the pixel defining layer, and an electrode on the barrier layer. According to some embodiments, the first electrode may include a (1_1)-th electrode and a (1_2)-th electrode. According to some embodiments, the pixel defining layer may be between the (1_1)-th electrode and the (1_2)-th electrode. According to some embodiments, the light emitting part may include a first light emitting part electrically connected to the (1_1)-th electrode and a second light emitting part electrically connected to the (1_2)-th electrode. According to some embodiments, the electrode and the barrier layer may be between the first light emitting part and the second light emitting part in a plan view.

According to some embodiments, the electrode, the barrier layer, and the pixel defining layer may overlap each other in a plan view.

According to some embodiments, a lower surface of the barrier layer may contact the pixel defining layer. According to some embodiments, an upper surface of the barrier layer may contact the electrode.

According to some embodiments, the electrode may have a first thermal conductivity. According to some embodiments, the barrier layer may have a second thermal conductivity less than the first thermal conductivity.

According to some embodiments, the first thermal conductivity to the second thermal conductivity may have a ratio in a range of 3.4 to 3600.

According to some embodiments, the electrode may include at least one of a group of molybdenum (Mo), copper (Cu), aluminum (Al), tungsten (W), gold (Au), or silver (Ag). According to some embodiments, the barrier layer may include at least one of a group of titanium (Ti), lead (Pb), aluminum oxide (SiOx), polyimide, silicon oxide (SiOx), or silicon nitride (SiNx).

According to some embodiments, the electrode and the barrier layer may be between the (1_1)-th electrode and the (1_2)-th electrode in a plan view.

According to some embodiments, the electrode and the barrier layer may be spaced apart from the first light emitting part and the second light emitting part in a direction in which the first light emitting part and the second light emitting part are spaced apart from each other.

According to some embodiments, a gap may be formed between the barrier layer and the light emitting part. According to some embodiments, in the gap, the second electrode and the pixel defining layer may contact each other.

According to some embodiments, side surfaces of each of the electrode and the barrier layer may form non-uniform side surfaces with each other.

According to some embodiments, the display device may further include a display area and a non-display area surrounding at least a portion of the display area, and a pulse input line electrically connected to the electrode. According to some embodiments, the pulse input line may be in the non-display area.

According to some embodiments, a side surface of each of the electrode and the barrier layer may form an intervening angle with an upper surface of the pixel defining layer. According to some embodiments, the intervening angle may be in a range of 15 degrees to 60 degrees.

According to some embodiments, the barrier layer may include a barrier protrusion that does not overlap the electrode in a plan view.

According to some embodiments, the barrier layer may include a groove in which at least a portion of the electrode is located. According to some embodiments, the barrier layer may cover at least a portion of a side surface of the electrode.

According to some embodiments, the electrode may include an electrode protrusion that does not overlap the barrier layer in a plan view.

According to some embodiments, the second electrode may be on a side surface of the electrode, the first light emitting part, and the second light emitting part.

According to some embodiments of the present disclosure, a display device may include a first sub-pixel forming a first sub-pixel area and a second sub-pixel forming a second sub-pixel area, and an electrode-barrier structure between the first sub-pixel area and the second sub-pixel area. According to some embodiments, the electrode-barrier structure may include a barrier layer having a first thermal conductivity, and an electrode contacting an upper surface of the barrier layer and having a second thermal conductivity greater than the first thermal conductivity.

According to some embodiments of the present disclosure, a method of manufacturing a display device may include patterning a first electrode including a (1_1)-th electrode and a (1_2)-th electrode on a base layer, patterning a pixel defining layer between the (1_1)-th electrode and the (1_2)-th electrode, forming an electrode-barrier structure including a barrier layer and an electrode on the pixel defining layer, forming a base light emitting part to cover the electrode-barrier structure and the first electrode, and removing at least a portion of the base light emitting part by providing a pulse input to the electrode-barrier structure. According to some embodiments, the electrode may have a thermal conductivity greater than that of the barrier layer.

According to some embodiments, removing may include dissipating joule heating from the electrode, and providing a first light emitting part and a second light emitting part spaced apart from each other.

According to some embodiments, removing may include exposing a portion of the pixel defining layer. According to some embodiments, the method may further include forming a second electrode. According to some embodiments, forming the second electrode may include contacting the pixel defining layer and the second electrode.

According to some embodiments of the present disclosure, a display device and a method of manufacturing the display device capable of reducing a risk such as a leakage current may be provided.

According to some embodiments of the present disclosure, a display device and a method of manufacturing the display device capable of preventing or reducing damage to configurations in the display device may be provided.

According to some embodiments of the present disclosure, a display device and a method of manufacturing the display device capable of implementing display performance of relatively high resolution may be provided.

BRIEF DESCRIPTION OF THE DRAWINGS

The above and other aspects of some embodiments of the present disclosure will become more apparent by describing in more detail aspects of some embodiments thereof with reference to the accompanying drawings, in which.

DETAILED DESCRIPTION

Figure 1:
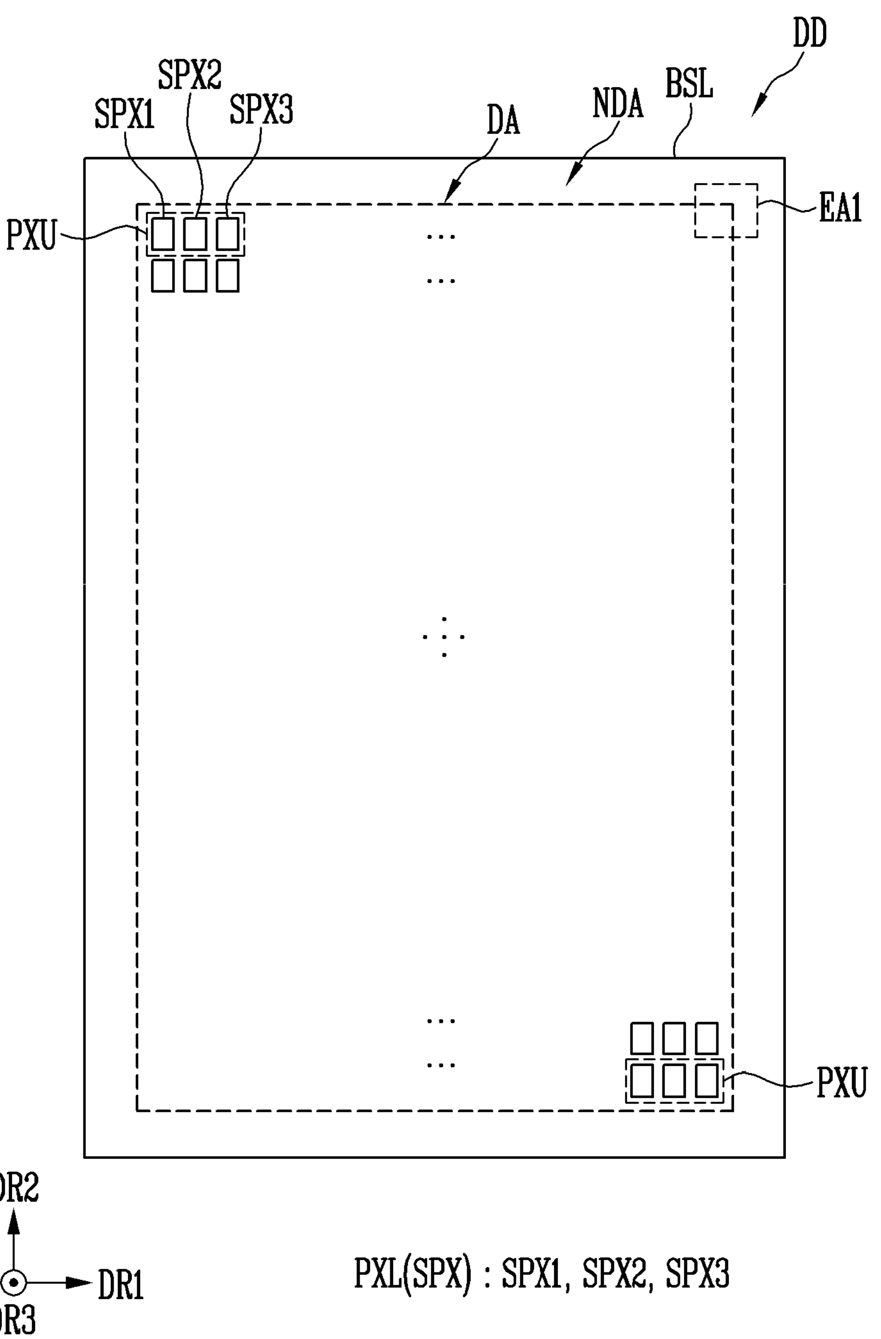
FIG. 1 is a schematic plan view illustrating a display device according to some embodiments.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. In the following description, the singular expressions include plural expressions unless the context clearly dictates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a layer, an area, a plate, or the like is referred to as being "on" another portion, it includes not only a case where the portion is "directly on" another portion, but also a case where there is further another portion between the portion and the other portion. In addition, in the present specification, when a portion of a layer, a layer, an area, a plate, or the like is formed on another portion, a forming direction is not limited to an upper direction but includes forming the portion on a side surface or in a lower direction. On the contrary, when a portion of a layer, a layer, an area, a plate, or the like is formed "under" another portion, this includes not only a case where the portion is "directly beneath" another portion but also a case where there is further another portion between the portion and the other portion.

The disclosure relates to a display device and a method of manufacturing the display device. Hereinafter, a display device and a method of manufacturing the display device according to some embodiments are described with reference to the accompanying drawings.

FIG. 1 is a schematic plan view illustrating a display device according to some embodiments.

The display device DD is configured to emit light. The display device DD includes a light emitting element LD. According to some embodiments, the display device DD may be provided in various forms. For example, the display device DD may be applied to a smart phone, a notebook, a tablet personal computer (PC), a wearable device (for example, a head-mounted device, a smart watch, smart glasses, or the like), a television, an infotainment system for a vehicle, and various other embodiments.

Referring to FIG. 1, the display device DD may include a base layer BSL and a pixel PXL located on the base layer BSL. As a person having ordinary skill in the art would appreciate, the display device DD may have any suitable number of pixels PXL according to the design and size of the display device DD. The display device DD may further include a driving circuit unit (for example, a scan driver and a data driver), lines, and pads for driving the pixel PXL.

The display device DD may include a display area DA and a non-display area NDA. The non-display area NDA may mean an area other than the display area DA. The non-display area NDA may surround at least a portion of the display area DA. According to some embodiments, the non-display area NDA may surround (e.g., located in a periphery or outside a footprint of) an entirety of the display area DA.

The base layer BSL may form a base member of the display device DD. The base layer BSL may be a rigid or flexible substrate or film. For example, the base layer BSL may be a rigid substrate formed of glass or tempered glass, a flexible substrate (or thin film) of a plastic or metal material, or at least one insulating layer. A material and/or a physical property of the base layer BSL are/is not particularly limited. According to some embodiments, the base layer BSL may be transparent or substantially transparent. Here, "substantially transparent" may mean that light may be transmitted at a level of one transmittance or more. According to some embodiments, the base layer BSL may be translucent or opaque. In addition, the base layer BSL may include a reflective material according to some embodiments.

The display area DA may refer to an area where the pixel PXL is located. The non-display area NDA may refer to an area in which the pixel PXL is not located. The driving circuit unit, the lines, and the pads connected to the pixel PXL of the display area DA may be located in the non-display area NDA.

According to some embodiments, the pixel PXL (or sub-pixels SPX) may be arranged in various structures. For example, the pixel PXL (or the sub-pixels SPX) may be arranged according to a stripe (for example, S-stripe) or PENTILE™ arrangement structure, or the like. According to some embodiments, sizes between the sub-pixels SPX may be partially different, and the sub-pixels SPX may have various shapes. For example, the sub-pixels SPX may have a quadrangular shape or a hexagonal shape in a plan view. However, embodiments according to the present disclosure are not necessarily limited thereto.

According to some embodiments, the pixel PXL includes a light emitting element LD. The pixel PXL (or the sub-pixels SPX) may include a first sub-pixel SPX1, a second sub-pixel SPX2, and a third sub-pixel SPX3. At least one of the first sub-pixel SPX1, the second sub-pixel SPX2, or the third sub-pixel SPX3 may form one pixel unit PXU configured to emit light of various colors.

For example, each of the first sub-pixel SPX1, the second sub-pixel SPX2, and the third sub-pixel SPX3 may emit light of one color. For example, the first sub-pixel SPX1 may be a red pixel emitting light of red (for example, first color), the second sub-pixel SPX2 may be a green pixel emitting light of green (for example, second color), and the third sub-pixel SPX3 may be a blue pixel emitting light of blue (for example, third color). The color, type, number, and/or the like of the first sub-pixel SPX1, the second sub-pixel SPX2, and the third sub-pixel SPX3 configuring each pixel unit PXU are/is not limited to a specific example.

Figure 2:
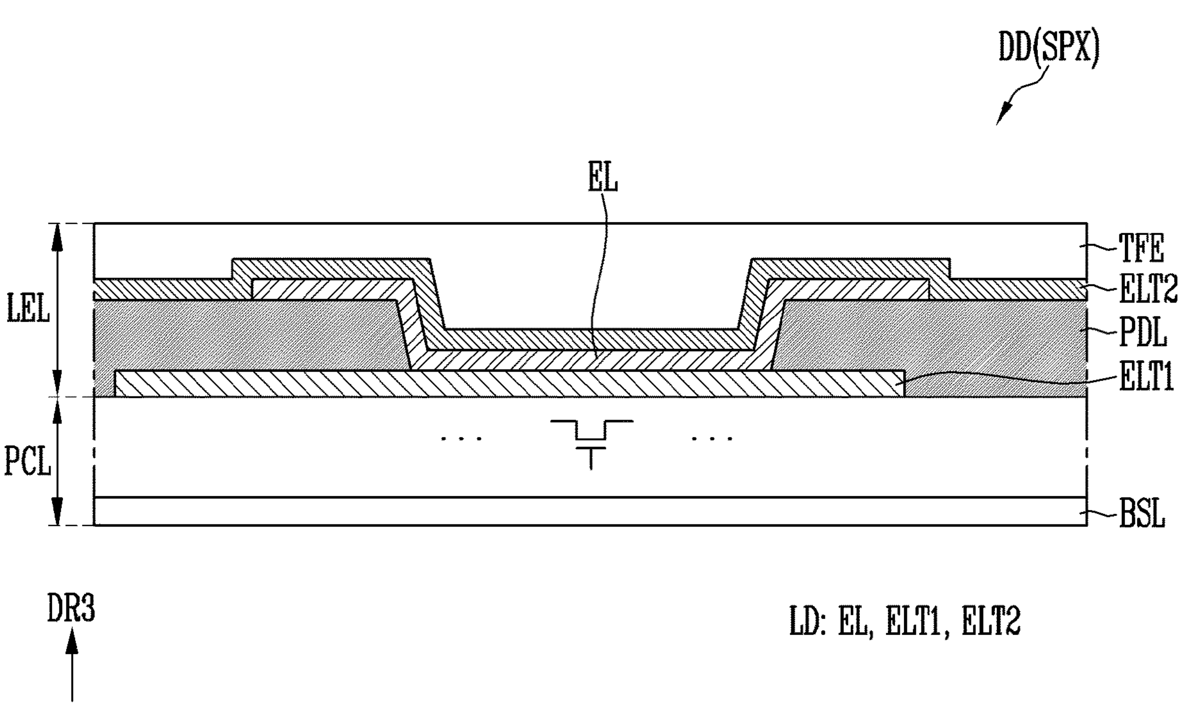
FIG. 2 is a schematic cross-sectional view illustrating a display device according to some embodiments.
Figure 3:
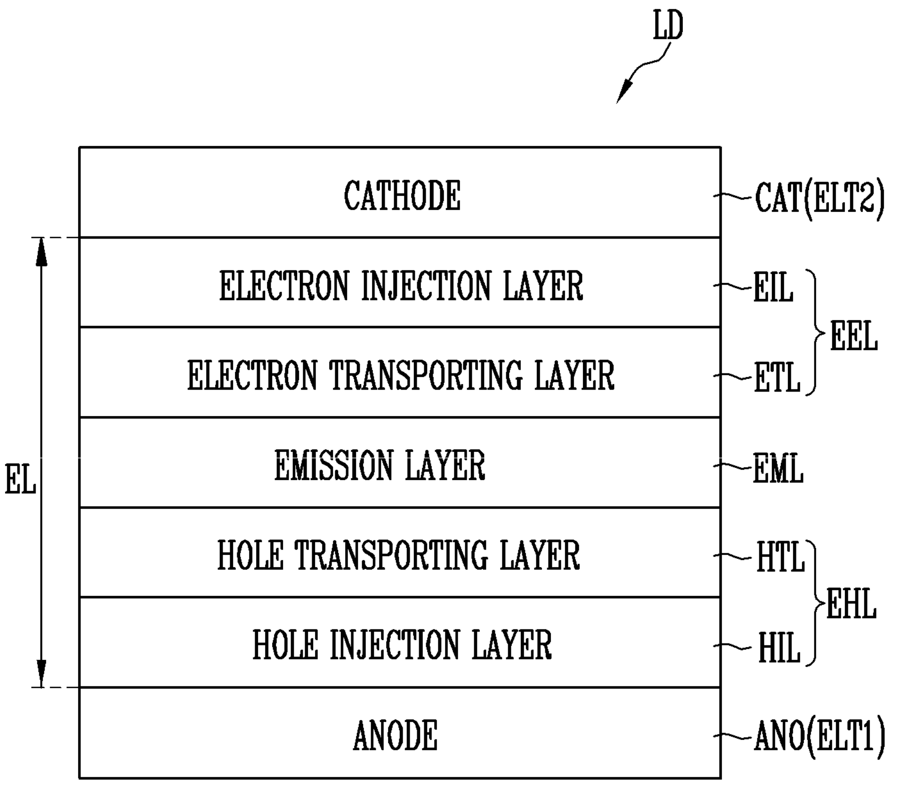
FIG. 3 is a schematic cross-sectional view illustrating a light emitting element according to some embodiments.

FIG. 2 is a schematic cross-sectional view illustrating further details of the display device DD according to some embodiments. FIG. 3 is a schematic cross-sectional view illustrating a light emitting element according to some embodiments.

Referring to FIGS. 2 and 3, the display device DD may include a pixel-circuit layer PCL and a light-emitting-element layer LEL.

The pixel-circuit layer PCL may be a layer including a pixel circuit PXC (refer to FIG. 4) for driving the light emitting elements LD. The pixel-circuit layer PCL may include the base layer BSL, conductive layers for forming pixel circuits, and insulating layers located between the conductive layers.

According to some embodiments, the pixel circuit PXC may include a thin film transistor and may be electrically connected to the light emitting elements LD to provide an electrical signal for the light emitting elements LD to emit light.

The light-emitting-element layer LEL may be located on the pixel-circuit layer PCL. According to some embodiments, the light-emitting-element layer LEL may include the light emitting element LD, a pixel defining layer PDL, and an encapsulation layer TFE.

The light emitting element LD may be located on the pixel-circuit layer PCL. According to some embodiments, the light emitting element LD may include a first electrode ELT1, a light emitting part EL, and a second electrode ELT2. According to some embodiments, the light emitting part EL may be located in an area defined by the pixel defining layer PDL. One surface of the light emitting part EL may be electrically connected to the first electrode ELT1, and another surface of the light emitting part EL may be electrically connected to the second electrode ELT2.

The first electrode ELT1 may be an anode electrode ANO for the light emitting part EL, and the second electrode ELT2 may be a cathode electrode CAT for the light emitting part EL. According to some embodiments, the first electrode ELT1 and the second electrode ELT2 may include a conductive material. For example, the conductive material may include one or more of a group of gold (Au), silver (Ag), aluminum (Al), molybdenum (Mo), chromium (Cr), titanium (Ti), nickel (Ni), neodymium (Nd), copper (Cu), and platinum (Pt). Alternatively, according to some embodiments, the conductive material may include one or more of a group of silver nanowire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide (SnO2), carbon nano tube, and graphene. However, embodiments according to the present disclosure are not necessarily limited thereto.

Meanwhile, according to some embodiments, the second electrode ELT2 may be manufactured by depositing the entire surface of the display area DA. Accordingly, power supplied to the second electrode ELT2 may be provided to each of the sub-pixels SPX. At this time, according to some embodiments, the second electrode ELT2 includes a metal material having a relatively low resistance so that an influence of the resistance of the second electrode ELT2 is relatively reduced. Accordingly, according to some embodiments, the second electrode ELT2 may include silver (Ag) or magnesium (Mg) without including aluminum (Al).

The light emitting part EL may have a multilayer thin film structure including a light generation layer (for example, a light emitting layer EML). The light emitting part EL may include an organic material. The light emitting part EL may include a hole injection layer HIL for injecting a hole, a hole transport layer HTL having an excellent hole transport property and for increasing a chance of recombination of a hole and an electron by suppressing a movement of an electron that is not combined in the light emitting layer EML, the light emitting layer EML emitting light by the recombination of the injected electron and hole, an electron transport layer ETL for smoothly transporting the electron to the light emitting layer, and an electron injection layer EIL for injecting the electron. The light emitting part EL may emit light based on an electrical signal provided from the anode electrode ANO (for example, the first electrode ELT1) and the cathode electrode CAT (for example, the second electrode ELT2).

The pixel defining layer PDL may be located on the pixel-circuit layer PCL to define a position where the light emitting part EL is arranged. According to some embodiments, the pixel defining layer PDL may include an inorganic material. For example, the pixel defining layer PDL may include one or more of silicon oxide (SiOx) and silicon nitride (SiNx). According to some embodiments, the pixel defining layer PDL may have a multilayer structure in which a layer including silicon oxide (SiOx) and a layer including silicon nitride (SiNx) are stacked. However, embodiments according to the present disclosure are not limited thereto. According to some embodiments, the pixel defining layer PDL may include an organic material. For example, the pixel defining layer PDL may include one or more of a group of acrylic resin, epoxy resin, phenol resin, polyamide resin, and polyimide resin.

The encapsulation layer TFE may be located on the light emitting element LD (for example, the second electrode ELT2). The encapsulation layer TFE may offset a step difference generated by the light emitting element LD and the pixel defining layer PDL. The encapsulation layer TFE may include a plurality of insulating layers covering the light emitting element LD. According to some embodiments, the encapsulation layer TFE may have a structure in which an inorganic layer and an organic layer are alternately stacked. According to some embodiments, the encapsulation layer TFE may be a thin film encapsulation layer.

According to some embodiments, the light-emitting-element layer LEL may further include an electrode-barrier structure ES (refer to FIG. 5) located between the light emitting parts EL (for example, between the first electrodes ELT1) of each of the adjacent sub-pixels SPX different from each other. Further details of the electrode-barrier structure ES are described later.

Figure 4:
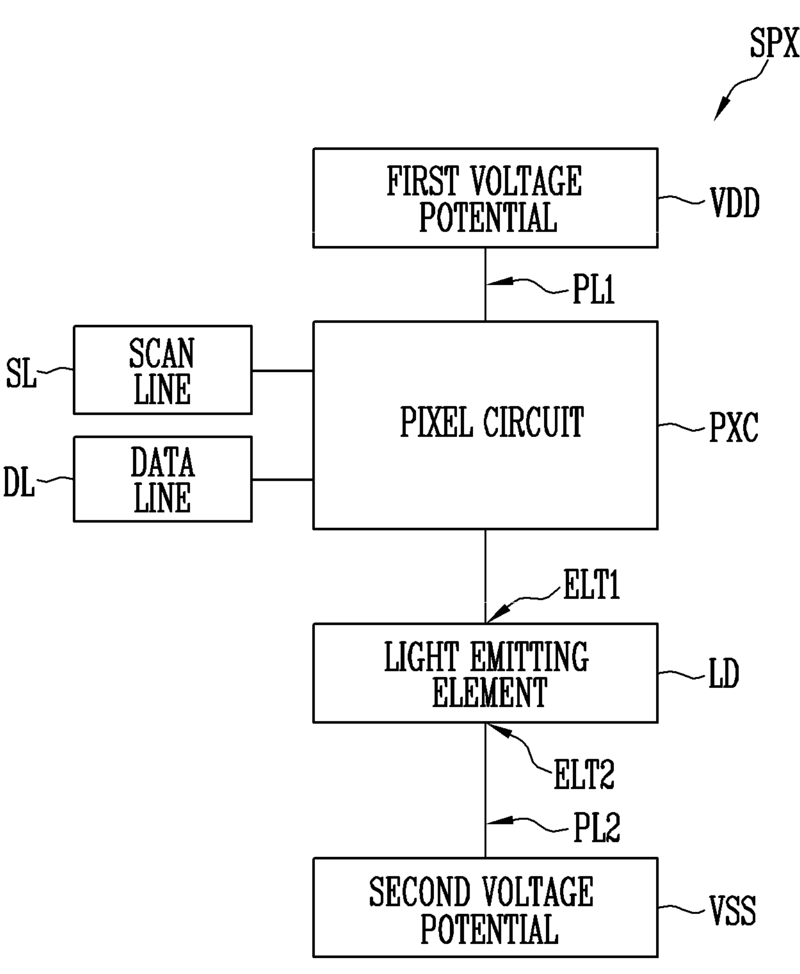
FIG. 4 is a schematic block diagram illustrating an electrical connection structure for a light emitting element according to some embodiments.

FIG. 4 is a schematic block diagram illustrating an electrical connection structure for a light emitting element according to some embodiments. For example, FIG. 4 may illustrate an electrical connection structure including the pixel circuit PXC corresponding to each sub-pixel SPX.

Referring to FIG. 4, the sub-pixel SPX may include the pixel circuit PXC configured to drive the light emitting element LD.

The pixel circuit PXC may include one or more circuit elements. For example, the pixel circuit PXC may include a transistor and a storage capacitor. For example, the pixel circuit PXC may include a driving transistor, a switching transistor, and a storage capacitor. However, embodiments according to the present disclosure are not necessarily limited thereto, and the pixel circuit PXC may further include an additional circuit element.

The pixel circuit PXC may be electrically connected to a scan line SL and a data line DL. The scan line SL may supply a scan signal to the pixel circuit PXC and may be electrically connected to a gate electrode of the switching transistor of the pixel circuit PXC according to some embodiments. The light emitting element LD may be configured to emit light corresponding to a data signal provided from the data line DL.

The pixel circuit PXC may be electrically connected to a first power line PL1 and a second power line PL2. For example, the first electrode ELT1 of the light emitting element LD may be electrically connected to the pixel circuit PXC and the first power line PL1, and the second electrode ELT2 of the light emitting element LD may be electrically connected to the second power line PL2. The first power line PL1 and the second power line PL2 may be located on the base layer BSL.

Power of the first power line PL1 and power of the second power line PL2 may have different potentials. For example, the power of the first power line PL1 may be high-potential pixel power receiving power from a first voltage potential VDD, and the power of the second power line PL2 may be low-potential pixel power receiving power from a second voltage potential VSS. A potential difference between the power of the first power line PL1 and the power of the second power line PL2 may be set to a threshold voltage or higher of the light emitting elements LD.

The first power line PL1 may be electrically connected to the pixel circuit PXC (for example, the driving transistor). The second power line PL2 may be electrically connected to the cathode electrode (for example, the second electrode ELT2) of the light emitting element LD.

According to some embodiments, the second power line PL2 may be electrically connected to the second electrode ELT2. For example, the second electrode ELT2 may receive the power through the second power line PL2 located in the non-display area NDA. For example, the second electrode ELT2 in the display area DA may be adjacent to the second power line PL2 with an area where the display area DA and the non-display area NDA adjacent to each other interposed therebetween. The second electrode ELT2 adjacent to an outside of the display area DA may be electrically connected to the second power line PL2 in the non-display area NDA. As described above, because the second electrodes ELT2 in the display area DA are electrically connected to each other, the power provided by the second power line PL2 may be applied to the entire display area DA.

Each light emitting element LD may be connected in a forward direction between the first power line PL1 and the second power line PL2 to form each effective light source. These effective light sources may be gathered to configure the light emitting elements LD of the sub-pixel SPX.

The light emitting elements LD may emit light with a luminance corresponding to a driving current supplied through the pixel circuit PXC. During each frame period, the pixel circuit PXC may supply the driving current corresponding to the data signal to the light emitting element LD. The light emitting element LD may emit light with a luminance corresponding to a current flowing therethrough.

A display device DD including an electrode-barrier structure ES according to some embodiments is described with reference to FIGS. 5 to 10. For convenience of description, a content that may overlap the above-described content is briefly described or is not repeated.

FIGS. 5 and 7 to 10 are schematic cross-sectional views illustrating a display device according to some embodiments. FIGS. 5 and 7 to 10 show a cross-sectional structure including an electrode-barrier structure ES according to some embodiments. FIG. 6 is a schematic enlarged view of an EA1 area of FIG. 1. FIG. 6 schematically shows a connection structure on a plane between the electrode-barrier structure ES and a pulse input line PIL.

Figure 5:
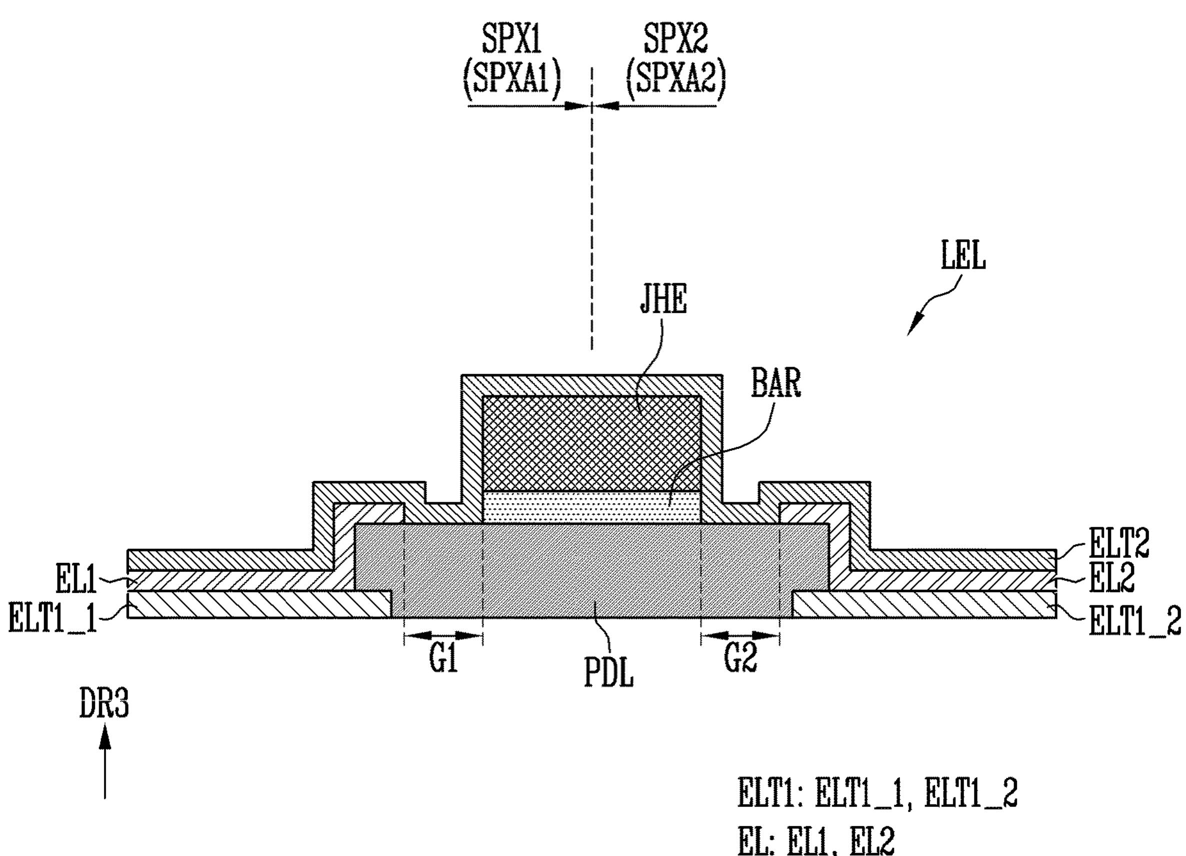
FIGS. 5 and 7 to 10 are schematic cross-sectional views illustrating a display device according to some embodiments.
Figure 6:
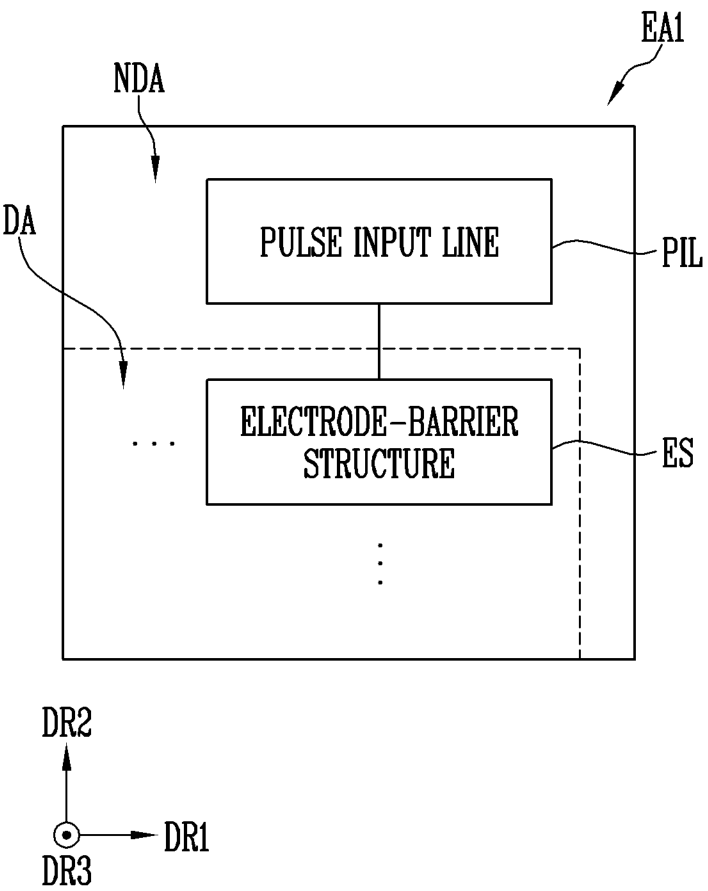
FIG. 6 is a schematic enlarged view of an EA1 area of FIG. 1 according to some embodiments.

First, with reference to FIGS. 5 and 6, a display device DD including an electrode-barrier structure ES according to some embodiments is described. For convenience of description, a content that may overlap the above-described content is briefly described or is not repeated.

Referring to FIGS. 5 and 6, the light-emitting-element layer LEL may include the electrode-barrier structure ES located between adjacent sub-pixels SPX (for example, adjacent sub-pixel areas SPXA). For convenience of description, the disclosure is description based on embodiments in which the adjacent sub-pixels SPX are the first sub-pixel SPX1 and the second sub-pixel SPX2. A technical feature described below may also be defined in an area between the first sub-pixel SPX1 and the third sub-pixel SPX3 and may also be defined in an area between the second sub-pixel SPX2 and the third sub-pixel SPX3.

According to some embodiments, the light emitting part EL may include a first light emitting part EL1 included in the first sub-pixel SPX1 (for example, located in the first sub-pixel area SPXA1) and a second light emitting part EL2 included in the second sub-pixel SPX2 (for example, located in the second sub-pixel area SPXA2).

According to some embodiments, the first electrode ELT1 may include a (1_1)-th electrode ELT1_1 included in the first sub-pixel SPX1 (for example, located in the first sub-pixel area SPXA1) and a (1_2)-th electrode ELT1_2 included in the second sub-pixel SPX2 (for example, located in the second sub-pixel area SPXA2).

According to some embodiments, the second electrode ELT2 may be arranged across the first sub-pixel area SPXA1 and the second sub-pixel area SPXA2. For example, a portion of the second electrode ELT2 may be electrically connected to the first light emitting part EL1, and another portion of the second electrode ELT2 may be electrically connected to the second light emitting part EL2.

According to some embodiments, the second electrode ELT2 may be deposited after the light emitting parts EL are patterned, and thus at least a portion of the second electrode ELT2 may be located on the pixel defining layer PDL in an area in a gap G.

According to some embodiments, the pixel defining layer PDL may be located between the first sub-pixel SPX1 and the second sub-pixel SPX2. For example, the pixel defining layer PDL may be located between the first sub-pixel area SPXA1 and the second sub-pixel area SPXA2.

The electrode-barrier structure ES may include a barrier layer BAR and an electrode JHE. The electrode-barrier structure ES may be located between the first sub-pixel SPX1 and the second sub-pixel SPX2. The electrode-barrier structure ES may be located between the first sub-pixel area SPXA1 and the second sub-pixel area SPXA2.

The electrode-barrier structure ES may be located on the pixel defining layer PDL. The electrode-barrier structure ES may overlap the pixel defining layer PDL in a plan view.

The electrode-barrier structure ES may be located between the (1_1)-th electrode ELT1_1 and the (1_2)-th electrode ELT1_2 in a plan view. The electrode-barrier structure ES may not overlap the (1_1)-th electrode ELT1_1 and the (1_2)-th electrode ELT1_2 in a plan view. For example, the electrode-barrier structure ES may be spaced apart from the (1_1)-th electrode ELT1_1 in a direction in which the (1_1)-th electrode ELT1_1 and the (1_2)-th electrode ELT1_2 are spaced apart from each other in a plan view. The electrode-barrier structure ES may be spaced apart from the (1_2)-th electrode ELT1_2 in the direction in which the (1_1)-th electrode ELT1_1 and the (1_2)-th electrode ELT1_2 are spaced apart from each other in a plan view.

The electrode-barrier structure ES may be located between the first light emitting part EL1 and the second light emitting part EL2 in a plan view.

The electrode-barrier structure ES may not overlap the first light emitting part EL1 and the second light emitting part EL2 in a plan view. For example, the electrode-barrier structure ES may be spaced apart from the first light emitting part EL1 in a direction in which the first light emitting part EL1 and the second light emitting part EL2 are spaced apart from each other in a plan view. The electrode-barrier structure ES may be spaced apart from the second light emitting part EL2 in the direction in which the first light emitting part EL1 and the second light emitting part EL2 are spaced apart from each other in a plan view. As the first light emitting part EL1 and the second light emitting part EL2 are spaced apart from each other, a leakage current risk between the adjacent sub-pixels SPX may be reduced.

According to some embodiments, the electrode-barrier structure ES may be spaced apart from the light emitting part EL with the gap G interposed therebetween. The gap G may include a first gap G1 and a second gap G2. For example, the first gap G1 may separate the electrode-barrier structure ES and the first light emitting part EL1. The second gap G2 may separate the electrode-barrier structure ES and the second light emitting part EL2.

The gap G may have a structure formed by removing an organic material deposited in an area corresponding to the gap G by thermal energy emitted from the electrode-barrier structure ES. According to some embodiments, the pixel defining layer PDL and the second electrode ELT2 may contact each other in the gap G. For example, the electrode-barrier structure ES (for example, the electrode JHE) may be electrically connected to the pulse input line PIL. The electrode-barrier structure ES may be provided with (for example, applied with) a pulse input from the pulse input line PIL. When the pulse input is applied to the electrode JHE, energy based on the pulse input may be emitted from the electrode JHE. At this time, an organic material layer located in an area adjacent to the electrode JHE may be removed. For example, after a base light emitting part BEL (refer to FIG. 11) for forming the first light emitting part EL1 and the second light emitting part EL2 is deposited, portions of the base light emitting part BEL adjacent to the electrode JHE may be removed by heat emitted from the electrode JHE, and thus the first light emitting part EL1 and the second light emitting part EL2 may be provided.

According to some embodiments, the pulse input line PIL may be located in the non-display area NDA. The pulse input line PIL may be electrically connected to the electrode-barrier structure ES in an area where the non-display area NDA and the display area DA are adjacent to each other. The electrode-barrier structure ES may be located on the pixel defining layer PDL, and may be arranged (for example, located) throughout the entire display area DA. Accordingly, the pulse input line PIL may be provided to the electrodes JHE distributed throughout the display area DA. However, embodiments according to the present disclosure are not necessarily limited thereto, and at least a portion of the pulse input line PIL may be located in the display area DA.

The barrier layer BAR may be located on the pixel defining layer PDL. The barrier layer BAR may be located between the electrode JHE and the pixel defining layer PDL. The barrier layer BAR may overlap the electrode JHE and the pixel defining layer PDL in a plan view.

The barrier layer BAR may not overlap the light emitting part EL in a plan view. The barrier layer BAR may be spaced apart from the first light emitting part EL1 and the second light emitting part EL2 with the first gap G1 and the second gap G2 interposed therebetween, respectively.

According to some embodiments, a side surface of the barrier layer BAR may contact the second electrode ELT2. An upper surface of the barrier layer BAR may contact the electrode JHE. A lower surface of the barrier layer BAR may contact the pixel defining layer PDL.

The barrier layer BAR may be a protective layer (for example, a barrier structure) for preventing or reducing damage to another structure directly located under the electrode JHE. The barrier layer BAR may separate the electrode JHE and the pixel defining layer PDL. Accordingly, a risk that a material characteristic of the pixel defining layer PDL may be distorted or lifespan of the light emitting element LD may be reduced, which may occur as the electrode JHE for heat application contacts the pixel defining layer PDL, may be reduced.

The electrode JHE may be located on the barrier layer BAR. For example, the electrode JHE may overlap the barrier layer BAR in a plan view. According to some embodiments, the electrode JHE may contact the second electrode ELT2. According to some embodiments, the electrode JHE may be electrically connected to the second electrode ELT2.

According to some embodiments, a side surface of the electrode JHE and the barrier layer BAR may form a non-uniform side surface. For example, side surfaces of each of the electrode JHE and the barrier layer BAR may form a discontinuous surface at positions adjacent to each other.

According to some embodiments, the electrode JHE may have a thickness thicker than that of the barrier layer BAR. In this case, a heat application range applied by the electrode JHE in a lateral direction may be expanded, and thus the light emitting part EL may be formed more minutely. However, embodiments according to the present disclosure are not limited thereto. According to some embodiments, the electrode JHE may have a thickness equal to or less than that of the barrier layer BAR.

As described above, the electrode JHE may have a structure for removing the organic material layer using thermal energy. For example, the electrode JHE may provide thermal energy generated by joule heating H (refer to FIG. 12). According to some embodiments, the joule heating H may generate an ambient temperature of about 400° C. or higher.

The electrode JHE and the barrier layer BAR may have different thermal conductivities. For example, the electrode JHE may have a first thermal conductivity, and the barrier layer BAR may have a second thermal conductivity less than the first thermal conductivity. According to some embodiments, a ratio of the first thermal conductivity to the second thermal conductivity may be 3.4 to 3600. When the first thermal conductivity and the second thermal conductivity satisfy the above-described ratio, the joule heating H may be defined based on a formation structure/position of the electrode JHE, and a risk that the joule heating H is diffused in an unintentional direction may be reduced.

Accordingly, the electrode-barrier structure ES may form a conductive structure having relatively high thermal conductivity and receiving the pulse input on an upper side, and may form a structure configured to block at least a portion of heat transferal according to the pulse input in accordance with a relatively low thermal conductivity on a lower side.

For example, the barrier layer BAR may be located under the electrode JHE, and thus the joule heating H may be diffused along an area where the electrode JHE is formed rather than a lower portion. For example, the joule heating H may be diffused from an area defined in a relatively upper side, and thus the organic material layer May be removed.

In this case, the gap G may be prevented from being formed excessively largely. When a size of the gap G is relatively reduced, a separation area where light is not emitted between the sub-pixel areas SPXA may be reduced, and thus display quality may be relatively improved.

That is, after forming the base light emitting part BEL, a portion of the base light emitting part BEL may be required to be removed and so as not to be excessively removed so that the light emitting part EL for each of the sub-pixels SPX is formed. According to some embodiments, because the electrode JHE dissipates heat from a relatively upper side, the gap G may be reduced, and thus the display device DD with relatively improved display quality may be provided.

In addition, because the barrier layer BAR is located under the electrode JHE, a risk of damage to other structures due to heat diffusion to a lower portion may be prevented or reduced. For example, when the pixel-defining layer PDL includes an organic material or a material that is relatively vulnerable to heat among inorganic materials experimentally, corresponding layers may be damaged by the joule heating H.

However, according to some embodiments, by specifically forming the barrier layer BAR having a thermal conductivity lower than that of the electrode JHE, even though the pixel defining layer PDL includes an organic material or a material that is relatively vulnerable to heat among inorganic materials, the risk of damage to the corresponding layers due to the joule heating H may be reduced.

According to some embodiments, the electrode JHE may include one of materials having thermal conductivity greater than a thermal conductivity of a material included in the barrier layer BAR. For example, the electrode JHE may include one or more of a group of molybdenum (Mo) (thermal conductivity: about 138 W/m° C.), copper (Cu) (thermal conductivity: about 386 W/m° C.), aluminum (AI) (thermal conductivity: about 204 W/m° C.), tungsten (W) (thermal conductivity: about 174 W/m° C.), gold (Au) (thermal conductivity: about 316 W/m° C.), and silver (Ag) (thermal conductivity: about 427 W/m° C.).

According to some embodiments, the barrier layer BAR may include one of materials having a thermal conductivity less than that of a material included in the electrode JHE. For example, the barrier layer BAR may include one or more of a group of titanium (Ti) (thermal conductivity: about 22 W/m° C.), lead (Pb) (thermal conductivity: about 36 W/m° C.), aluminum oxide (SiOx) (thermal conductivity: about 39.5 W/m° C.), polyimide (thermal conductivity: about 0.12 W/m° C.), silicon oxide (SiOx) (thermal conductivity: about 1.1 W/m° C.), and silicon nitride (SiNx) (thermal conductivity: about 20 W/m° C.).

Figure 7:
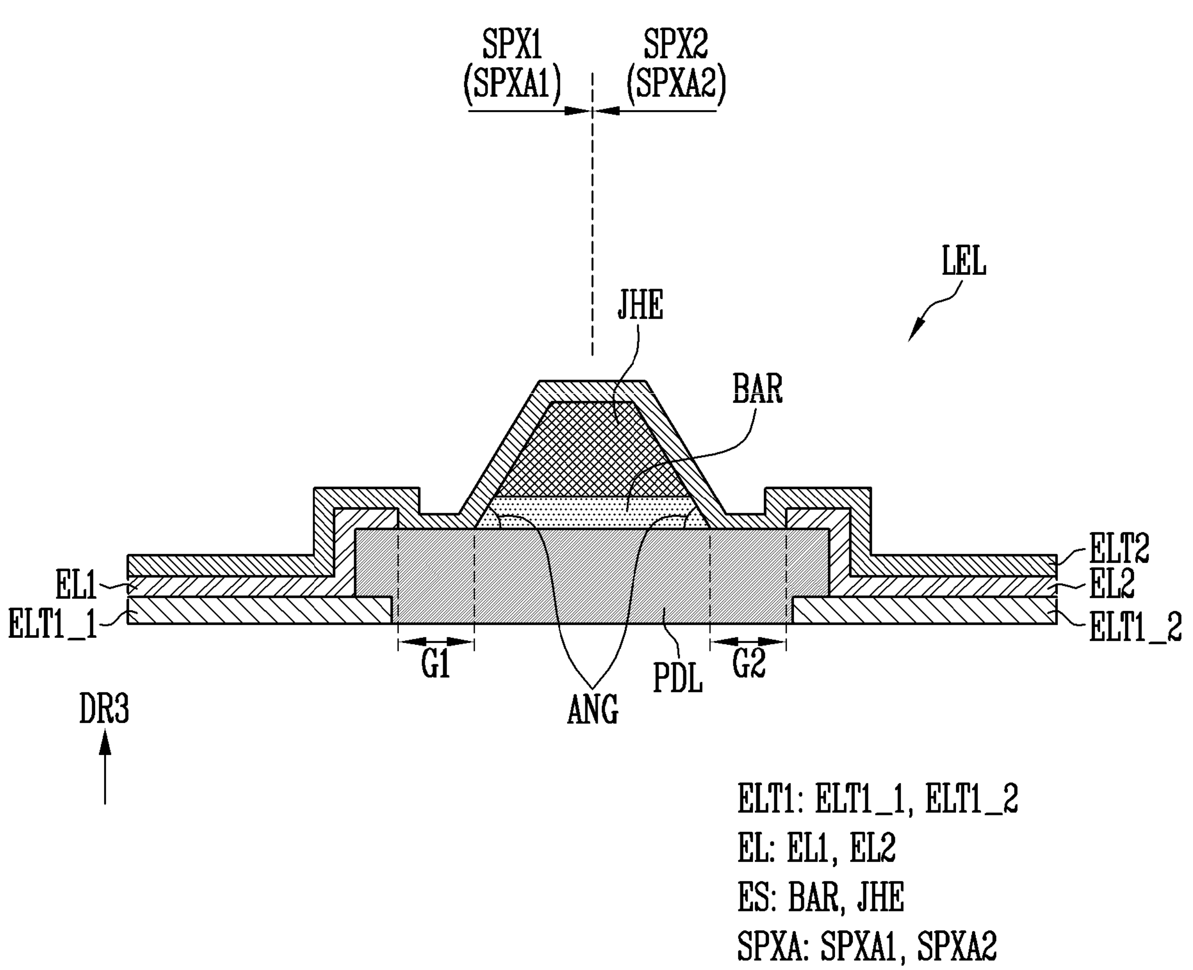

Next, a display device DD including an electrode-barrier structure ES according to some embodiments is described with reference to FIG. 7. In comparison with one or more embodiments described above, differences are mainly described. For convenience of description, a contents that may overlap the above-described content is briefly described or is not repeated.

The display device DD according to some embodiments is different from the display device DD according to the above-described embodiments, in that the electrode-barrier structure ES forms an intervening angle ANG with respect to an upper surface of the pixel defining layer PDL.

For example, the barrier layer BAR may form the intervening angle ANG with respect to the upper surface of the pixel defining layer PDL. The electrode JHE may form the intervening angle ANG with respect to the upper surface of the pixel defining layer PDL.

According to some embodiments, a side surface (for example, a surface facing the light emitting part EL) of the electrode-barrier structure ES may form the intervening angle ANG with the upper surface of the pixel defining layer PDL.

According to some embodiments, the intervening angle ANG may be 75 degrees or less. According to some embodiments, the intervening angle ANG may be in a range of 15 degrees to 60 degrees. According to some embodiments, the intervening angle ANG may be in a range of 45 degrees to 60 degrees. However, embodiments according to the present disclosure are not limited thereto.

Figure 8:
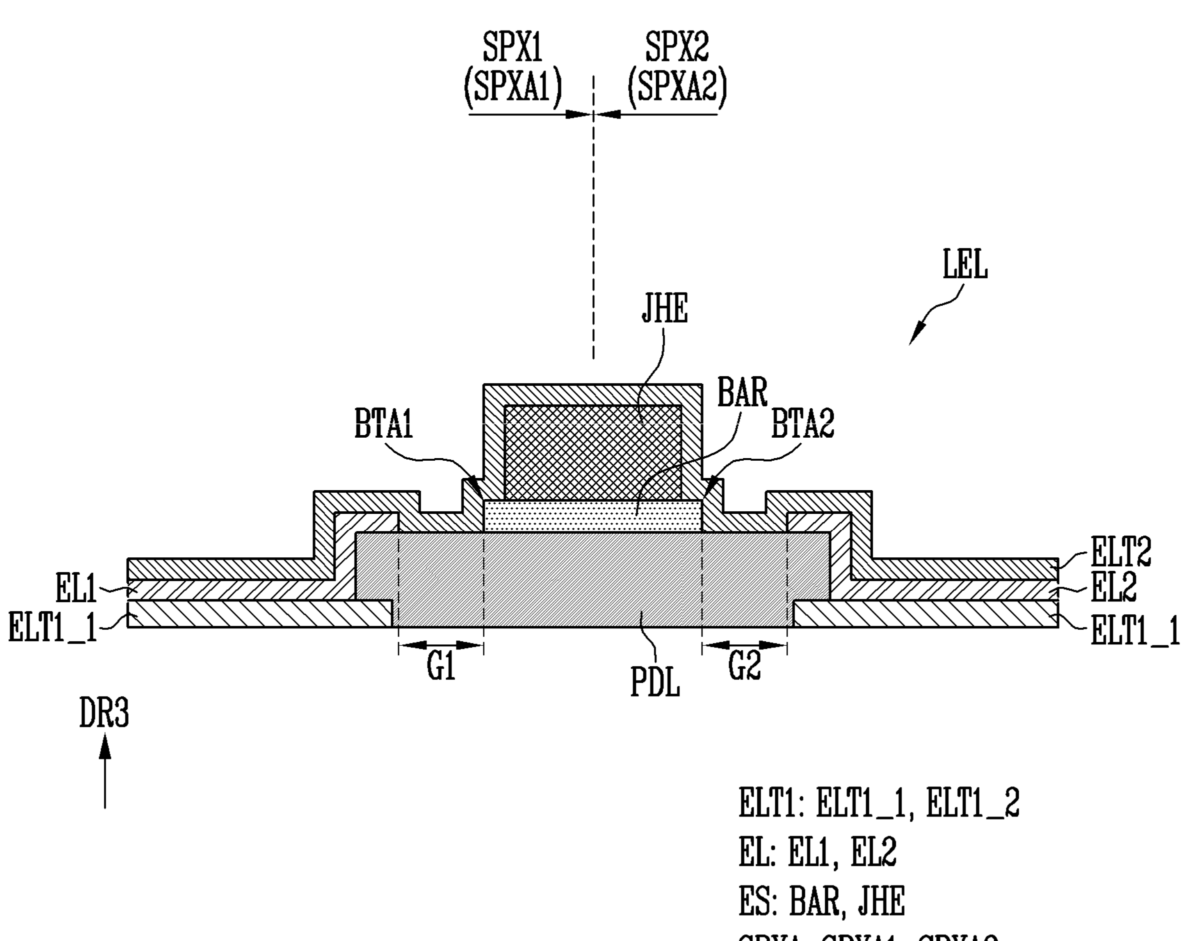

Next, a display device DD including an electrode-barrier structure ES according to some embodiments is described with reference to FIG. 8. In comparison with one or more embodiments described above, differences are mainly described. For convenience of description, a content that may overlap the above-described content is briefly described or is not repeated.

The display device DD according to some embodiments is different from the display device DD according to the above-described embodiments, in that the electrode JHE has a width narrower than that of the barrier layer BAR.

According to some embodiments, in a plan view, the electrode JHE may be entirely included in the barrier layer BAR. For example, the barrier layer BAR may include a barrier protrusion BTA that does not overlap the electrode JHE in a plan view. The barrier protrusion BTA may include a first barrier protrusion BTA1 and a second barrier protrusion BTA2.

The first barrier protrusion BTA1 may protrude toward the first light emitting part EL1. The first barrier protrusion BTA1 may directly adjacent to the first gap G1. The second barrier protrusion BTA2 may protrude toward the second light emitting part EL2. The second barrier protrusion BTA2 may directly adjacent to the second gap G2.

According to some embodiments, because the barrier protrusion BTA is formed, a risk that the joule heating H formed by the electrode JHE is applied to a lower portion may be further prevented or reduced.

Figure 9:
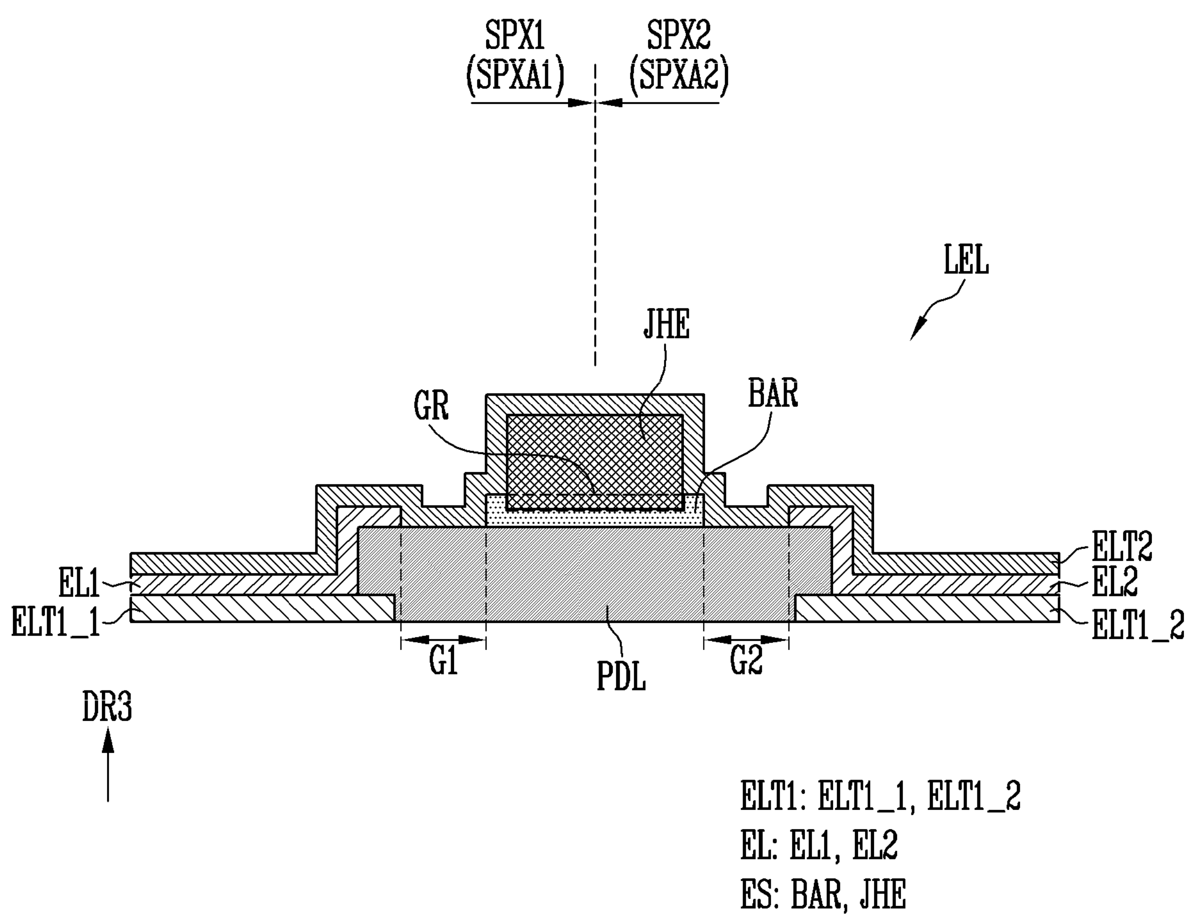

Next, a display device DD including an electrode-barrier structure ES according to some embodiments is described with reference to FIG. 9. In comparison with one or more embodiments described above, differences are mainly described. For convenience of description, a content that may overlap the above-described content is briefly described or is not repeated.

The display device DD according to some embodiments is different from the display device DD according to the above-described embodiments, in that a portion of the electrode JHE is located in a groove GR formed by the barrier layer BAR.

According to some embodiments, the barrier layer BAR may include the groove GR into which at least a portion is inserted. The electrode JHE may be located in the groove GR, and thus the barrier layer BAR may cover a side surface of the electrode JHE. For example, a portion of the barrier layer BAR may cover a lower portion of the side surface of the electrode JHE and may expose an upper portion of the side surface of the electrode JHE. According to some embodiments, the barrier layer BAR may entirely cover a lower surface of the electrode JHE.

According to some embodiments, as the barrier layer BAR covers the lower surface of the electrode JHE and at least a portion of the lower portion of the side surface of the electrode JHE, a risk that the joule heating H formed by the electrode JHE is applied to the lower portion may be further prevented or reduced.

Figure 10:
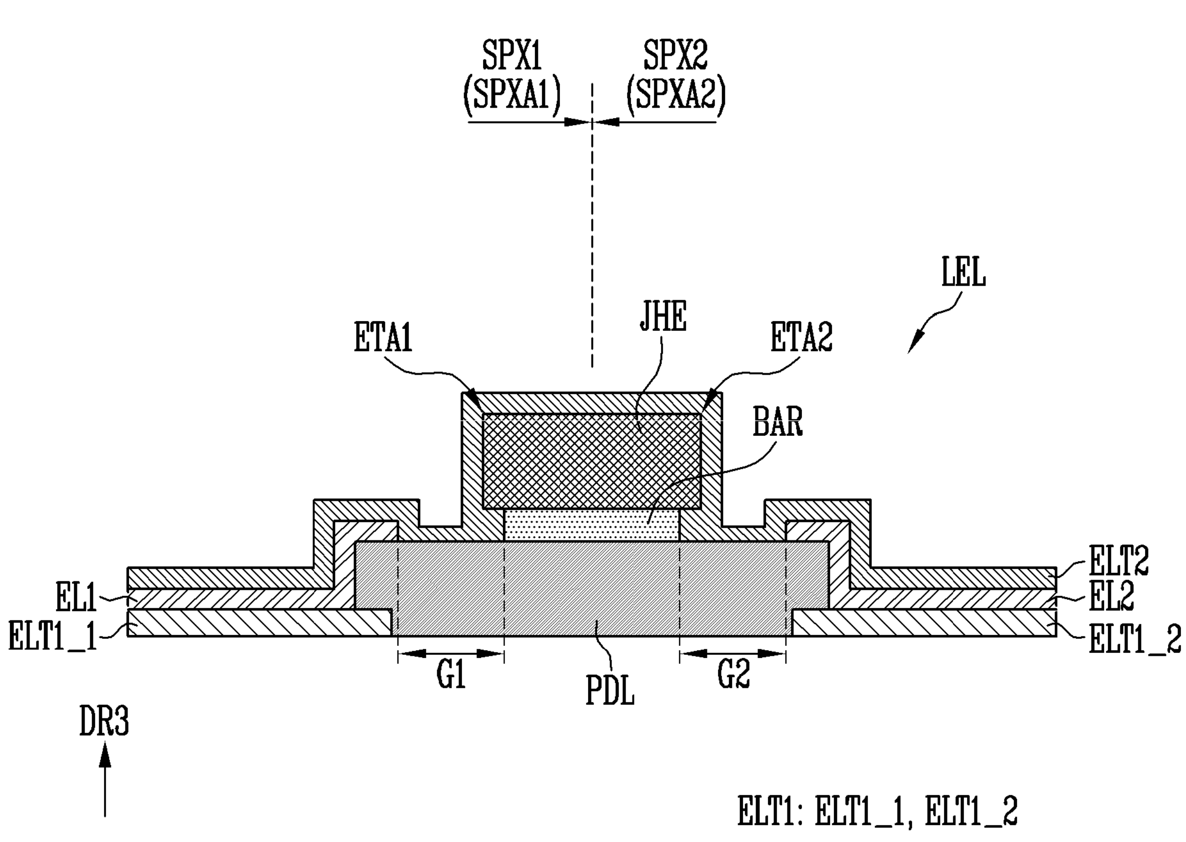

Next, a display device DD including an electrode-barrier structure ES according to some embodiments is described with reference to FIG. 10. In comparison with one or more embodiments described above, differences are mainly described. For convenience of description, a content that may overlap the above-described content is briefly described or is not repeated.

The display device DD according to some embodiments is different from the display device DD according to the above-described embodiments, in that the electrode JHE has a width wider than that of the barrier layer BAR.

According to some embodiments, in a plan view, the barrier layer BAR may be entirely included in the electrode JHE. For example, the electrode JHE may include an electrode protrusion ETA that does not overlap the barrier layer BAR in a plan view. The electrode protrusion ETA may include a first electrode protrusion ETA1 and a second electrode protrusion ETA2.

The first electrode protrusion ETA1 may protrude toward the first light emitting part EL1. The first electrode protrusion ETA1 may directly adjacent to the first gap G1. The second electrode protrusion ETA2 may protrude toward the second light emitting part EL2. The second electrode protrusion ETA2 may directly adjacent to the second gap G2.

According to some embodiments, because the electrode protrusion ETA is formed, the base light emitting part BEL may be more minutely removed, and because diffusion reliability of the joule heating H is secured, the electrode EL may be patterned more narrowly. In addition, because a size of the pixel defining layer PDL is reduced, a size of the gap G may be reduced, and thus a display device DD having relatively higher resolution may be manufactured.

A method of manufacturing a display device DD including an electrode-barrier structure ES according to some embodiments is described with reference to FIGS. 11 to 13. For convenience of description, a content that may overlap the above-described content is briefly described or is not repeated. For convenience of description, a content that may overlap the above-described content is briefly described or is not repeated.

Figure 11:
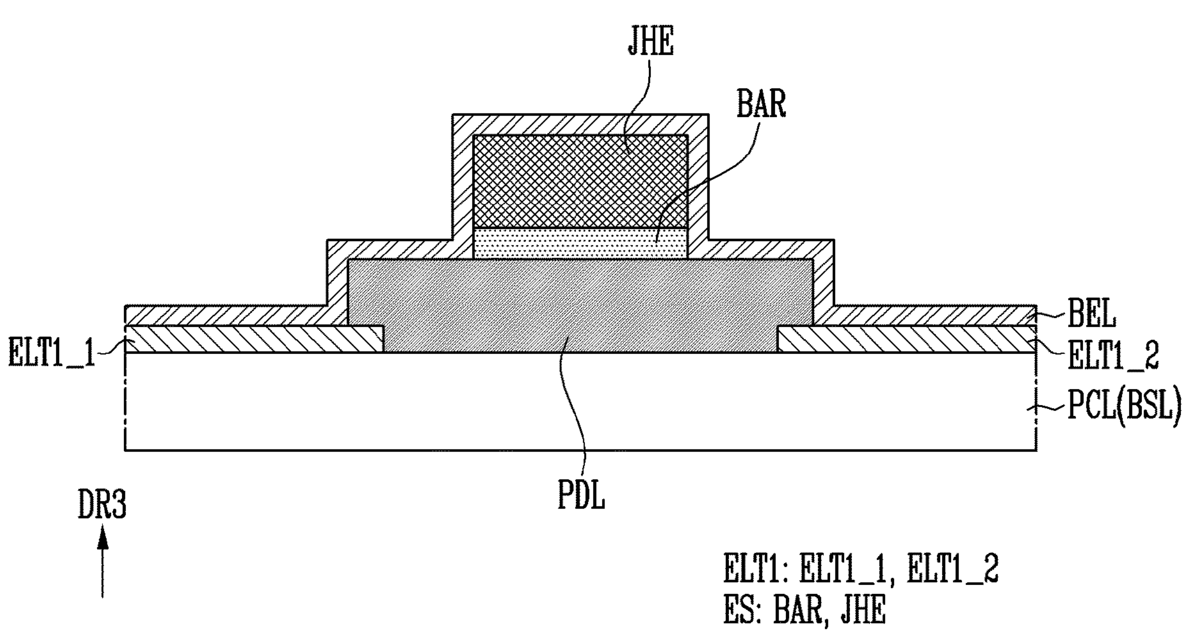
FIGS. 11 to 13 are schematic cross-sectional views for each process operation illustrating a method of manufacturing a display device according to some embodiments.
Figure 12:
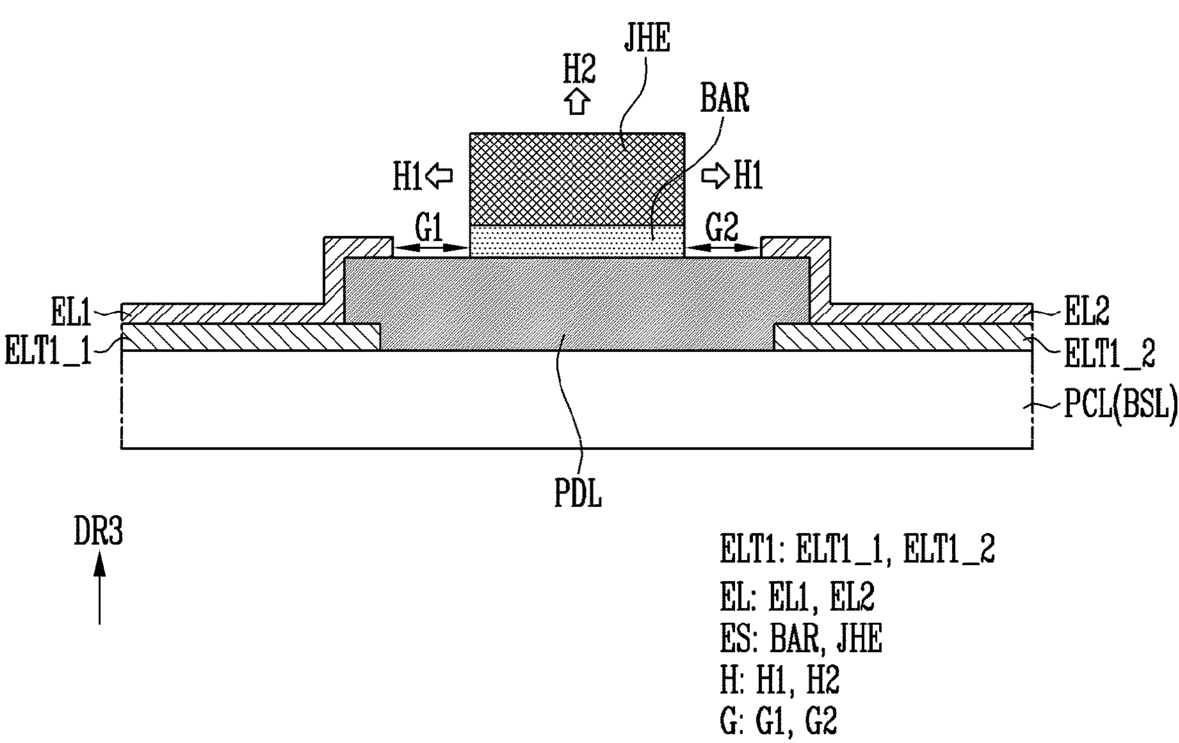
Figure 13:
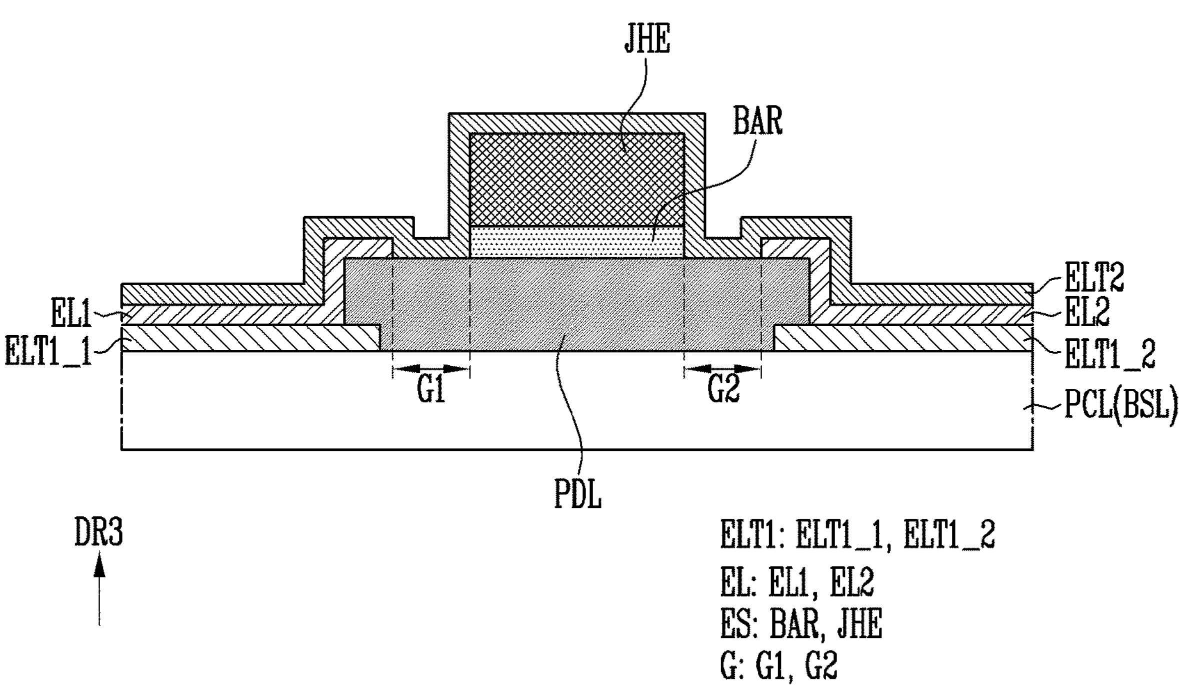

FIGS. 11 to 13 are schematic cross-sectional views for each process operation illustrating a method of manufacturing a display device according to some embodiments. For convenience of description, FIGS. 11 to 13 are shown based on a cross-sectional structure described with reference to FIG. 5 among the above-described embodiments, and the described structural feature may be equally applicable to other embodiments.

Referring to FIG. 11, a method of manufacturing a display device DD according to some embodiments may include manufacturing the pixel-circuit layer PCL including the base layer BSL, and patterning the first electrode ELT1, the pixel defining layer PDL, the barrier layer BAR, the electrode JHE, and the base light emitting part BEL on the pixel-circuit layer PCL.

A conductive layer or an insulating layer on the base layer BSL may be formed based on a typical process for manufacturing a semiconductor device. For example, the conductive layer or the insulating layer on the base layer BSL may be formed by a photolithography process and may be deposited by various methods (sputtering, chemical vapor deposition, and the like). The embodiments according to the present disclosure are not necessarily limited to a particular example.

In the present operation, conductive layers for forming the pixel circuit PXC on the base layer BSL may be patterned.

In the present operation, the (1_1)-th electrode ELT1_1 and the (1_2)-th electrode ELT1_2 spaced apart from each other may be patterned to form the anode electrode ANO of each of the sub-pixels SPX different from each other on the pixel-circuit layer PCL.

In the present operation, the pixel defining layer PDL may be patterned to cover an end of the (1_1)-th electrode ELT1_1 and an end of the (1_2)-th electrode ELT1_2.

According to some embodiments, the electrode-barrier structure ES may be patterned before the base light emitting part BEL is formed (for example, deposited). For example, the barrier layer BAR may be directly patterned on the pixel defining layer PDL, and the electrode JHE may be directly patterned on the barrier layer BAR. Accordingly, a lower surface of the barrier layer BAR may contact the pixel defining layer PDL, and an upper surface of the barrier layer BAR may contact the electrode JHE.

According to some embodiments, in order to pattern the electrode-barrier structure ES, a barrier material layer for forming the barrier layer BAR may be deposited and an electrode material layer for forming the electrode JHE may be deposited. The barrier material layer and the electrode material layer may be simultaneously etched, or may be etched in separate processes according to some embodiments.

The base light emitting part BEL may be a layer for forming each of the light emitting parts EL as subsequent processes are performed by including an organic material. The base light emitting part BEL may be deposited on the entire surface to cover (1_1)-th electrode ELT1_1, the (1_2)_th electrode ELT1_2, the pixel defining layer PDL, a side surface of the barrier layer BAR, and the electrode JHE. Accordingly, when the present operation is performed, an organic material layer on the (1_1)-th electrode ELT1_1 and an organic material layer on the (1_2)-th electrode ELT1_2 may maintain a state in which the organic material layer on the (1_1)-th electrode ELT1_1 and the organic material layer on the (1_2)-th electrode ELT1_2 are connected to each other.

According to some embodiments, an operation of electrically connecting the electrode JHE and the pulse input line PIL to each other may be performed.

Referring to FIG. 12, the method of manufacturing the display device DD according to some embodiments may include removing at least a portion of the base light emitting part BEL.

In the present operation, the pulse input may be applied to the electrode JHE through the pulse input line PIL, and the joule heating H may be emitted from the electrode JHE. According to some embodiments, the joule heating H may include a first joule heating H1 radiating in a side surface direction of the electrode JHE and a second joule heating H2 radiating in an upper side direction of the electrode JHE.

According to some embodiments, as the first joule heating H1 is emitted, at least a portion of the base light emitting part BEL formed in a side direction of the electrode JHE may be removed. Accordingly, the first light emitting part EL1 may be provided and the first gap G1 directly adjacent to the first light emitting part EL1 may be formed. The second light emitting part EL2 may be provided and the second gap G2 directly adjacent to the second light emitting part EL2 may be formed.

According to some embodiments, the barrier layer BAR having a relatively low thermal conductivity may be formed under the electrode JHE, and thus the first joule heating H1 may diffuse preferentially in a side surface direction. That is, a risk that the first joule heating H1 is diffused to a lower portion of the electrode JHE may be reduced, thereby reducing a risk that configurations located at a lower portion, such as the pixel defining layer PDL are damaged.

According to some embodiments, as the second joule heating H2 is emitted, at least a portion of the base light emitting part BEL formed on an upper side of the electrode JHE may be removed. Accordingly, because the base light emitting part BEL located above the electrode JHE is removed, the first light emitting part EL1 and the second light emitting part EL2 may be minutely separated. Meanwhile, the barrier layer BAR having a relatively low thermal conductivity may be formed below the electrode JHE, and thus the joule heating H may be diffused relatively predominantly in an upper side direction. Therefore, while the gap G is relatively reduced, the first light emitting part EL1 and the second light emitting part EL2 may be separated with relatively higher reliability.

In the present operation, because the gap G is formed, a portion of the pixel defining layer PDL may be exposed.

Referring to FIG. 13, the method of manufacturing the display device DD according to some embodiments may include forming the second electrode ELT2.

According to some embodiments, the second electrode ELT2 may be deposited on the entire surface. Accordingly, a portion of the second electrode ELT2 may be electrically connected to the first light emitting part EL1, another portion of the second electrode ELT2 may be electrically connected to the second light emitting part EL2, and still another portion of the second electrode ELT2 may be connected to the electrode JHE.

In the present operation, the pixel defining layer PDL and the second electrode ELT2 may contact each other through a portion of the pixel defining layer PDL exposed through the gap G.

Thereafter, according to some embodiments, the encapsulation layer TFE may be located on the second electrode ELT2, and the display device DD according to some embodiments may be provided.

As described above, although the disclosure has been described with reference to the embodiments described above, those skilled in the art or those having a common knowledge in the art will understand that the disclosure may be variously modified and changed without departing from the spirit and technical area of the disclosure described in the claims, and their equivalents, which will be described later.

Therefore, the technical scope of the disclosure should not be limited to the contents described in the detailed description of the specification, but should be defined by the appended claims, and their equivalents.

What is claimed is:

1. A display device comprising:

a light emitting element on a base layer and including a first electrode, a second electrode, and a light emitting part electrically connected between the first electrode and the second electrode;

a pixel defining layer on the base layer;

a barrier layer on the pixel defining layer; and a third electrode on the barrier layer, wherein the first electrode includes a (1_1)-th electrode and a (1_2)-th electrode, the pixel defining layer is between the (1_1)-th electrode and the (1_2)-th electrode, the light emitting part includes a first light emitting part electrically connected to the (1_1)-th electrode and a second light emitting part electrically connected to the (1_2)-th electrode, and the third electrode and the barrier layer are between the first light emitting part and the second light emitting part in a plan view.

2. The display device according to claim 1, wherein the third electrode, the barrier layer, and the pixel defining layer overlap each other in the plan view.

3. The display device according to claim 2, wherein a lower surface of the barrier layer contacts the pixel defining layer, and an upper surface of the barrier layer contacts the third electrode.

4. The display device according to claim 1, wherein the third electrode has a first thermal conductivity, and the barrier layer has a second thermal conductivity less than the first thermal conductivity.

5. The display device according to claim 4, wherein the first thermal conductivity to the second thermal conductivity has a ratio in a range of 3.4 to 3600.

6. The display device according to claim 4, wherein the third electrode includes at least one of molybdenum (Mo), copper (Cu), aluminum (Al), tungsten (W), gold (Au), or silver (Ag), and the barrier layer includes at least one of titanium (Ti), lead (Pb), aluminum oxide (SiOx), polyimide, silicon oxide (SiOx), or silicon nitride (SiNx).

7. The display device according to claim 1, wherein the third electrode and the barrier layer are between the (1_1)-th electrode and the (1_2)-th electrode in the plan view.

8. The display device according to claim 1, wherein the third electrode and the barrier layer are spaced apart from the first light emitting part and the second light emitting part in a direction in which the first light emitting part and the second light emitting part are spaced apart from each other.

9. The display device according to claim 8, wherein a gap is formed between the barrier layer and the light emitting part, and in the gap, the second electrode and the pixel defining layer contact each other.

10. The display device according to claim 1, wherein side surfaces of each of the third electrode and the barrier layer form non-uniform side surfaces with each other.

11. The display device according to claim 1, further comprising:

a display area and a non-display area surrounding at least a portion of the display area; and a pulse input line electrically connected to the third electrode, wherein the pulse input line is in the non-display area.

12. The display device according to claim 1, wherein a side surface of each of the third electrode and the barrier layer forms an intervening angle with an upper surface of the pixel defining layer, and the intervening angle is in a range of 15 degrees to 60 degrees.

13. The display device according to claim 1, wherein the barrier layer includes a barrier protrusion that does not overlap the third electrode in the plan view.

14. The display device according to claim 1, wherein the barrier layer includes a groove in which at least a portion of the third electrode is located, and the barrier layer covers at least a portion of a side surface of the third electrode.

15. The display device according to claim 1, wherein the third electrode includes an electrode protrusion that does not overlap the barrier layer in the plan view.

16. The display device according to claim 1, wherein the second electrode is on a side surface of the third electrode, the first light emitting part, and the second light emitting part.

17. A display device comprising:

a first sub-pixel forming a first sub-pixel area and a second sub-pixel forming a second sub-pixel area; and an electrode-barrier structure between the first sub-pixel area and the second sub-pixel area, wherein the electrode-barrier structure includes a barrier layer having a first thermal conductivity, and an electrode contacting an upper surface of the barrier layer and having a second thermal conductivity greater than the first thermal conductivity.

18. A method of manufacturing a display device, the method comprising:

patterning a first electrode including a (1_1)-th electrode and a (1_2)-th electrode on a base layer;

patterning a pixel defining layer between the (1_1)-th electrode and the (1_2)-th electrode;

forming an electrode-barrier structure including a barrier layer and a third electrode on the pixel defining layer;

forming a base light emitting part to cover the electrode-barrier structure and the first electrode; and removing at least a portion of the base light emitting part by providing a pulse input to the electrode-barrier structure, wherein the third electrode has a thermal conductivity greater than a thermal conductivity of the barrier layer.

19. The method according to claim 18, wherein removing the portion of the base light emitting part comprises:

dissipating joule heating from the third electrode; and providing a first light emitting part and a second light emitting part spaced apart from each other.

20. The method according to claim 18, wherein removing the portion of the base light emitting part comprises exposing a portion of the pixel defining layer, and the method further comprises forming a second electrode; and forming the second electrode comprises contacting the pixel defining layer and the second electrode.

* * * * *